United States Patent
Lanzillo et al.

(10) Patent No.: US 11,682,617 B2
(45) Date of Patent: Jun. 20, 2023

(54) HIGH ASPECT RATIO VIAS FOR INTEGRATED CIRCUITS

(71) Applicant: International Business Machines Corporation, Armonk, NY (US)

(72) Inventors: Nicholas Anthony Lanzillo, Wynantskill, NY (US); Somnath Ghosh, Clifton Park, NY (US); Lawrence A. Clevenger, Saratoga Springs, NY (US); Robert Robison, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/129,971

(22) Filed: Dec. 22, 2020

(65) Prior Publication Data

US 2022/0199521 A1    Jun. 23, 2022

(51) Int. Cl.
*H01L 23/522* (2006.01)
*H01L 23/528* (2006.01)
*H01L 23/532* (2006.01)
*H01L 21/768* (2006.01)

(52) U.S. Cl.
CPC ........ *H01L 23/5226* (2013.01); *H01L 23/528* (2013.01); *H01L 23/53209* (2013.01); *H01L 23/53295* (2013.01); *H01L 21/7682* (2013.01); *H01L 23/5222* (2013.01)

(58) Field of Classification Search
CPC ............... H01L 23/5226; H01L 23/528; H01L 23/53209; H01L 23/53295; H01L 21/7682; H01L 23/5222
See application file for complete search history.

(56) References Cited

U.S. PATENT DOCUMENTS

| | | | |
|---|---|---|---|
| 3,648,131 A | 3/1972 | Stuby | |
| 5,693,568 A | 12/1997 | Liu | |
| 8,357,609 B2 | 1/2013 | Ryan | |
| 9,054,164 B1 | 6/2015 | Jezewski | |
| 9,502,350 B1 | 11/2016 | Bonilla | |
| 9,601,426 B1 | 3/2017 | Bonilla | |
| 9,613,861 B2 | 4/2017 | Anderson | |
| 10,020,223 B1 * | 7/2018 | Anderson | ......... H01L 23/53238 |
| 2011/0233620 A1 * | 9/2011 | Naruse | ............. H01L 27/14638 |
| | | | 257/E31.085 |
| 2012/0068346 A1 | 3/2012 | Ponoth | |

(Continued)

OTHER PUBLICATIONS

International Search Report and Written Opinion dated Feb. 4, 2022, for International Application No. PCT/EP2021/081420, filed Nov. 11, 2021.

*Primary Examiner* — Patricia D Valenzuela
(74) *Attorney, Agent, or Firm* — Grant M. McNeilly

(57) ABSTRACT

An interlayer interconnect for an integrated circuit includes a first line in a first wiring layer, a first via portion integral to and extending from the first line, and a second line in a second wiring layer that is adjacent to the first wiring layer. The interlayer interconnect also includes a third line in the second wiring layer that is a first distance from the second line, wherein the first distance is a pitch of the second wiring layer, and a second via portion integral to and extending from the second line and in electrical contact with the first via portion at an interface to form a via. The via extends a second distance that is at least one-and-a-quarter times the pitch.

20 Claims, 5 Drawing Sheets

(56) References Cited

U.S. PATENT DOCUMENTS

| | | |
|---|---|---|
| 2015/0056800 A1 | 2/2015 | Mebarki |
| 2016/0197011 A1 | 7/2016 | Bristol |
| 2017/0040216 A1 | 2/2017 | Anderson |
| 2017/0221815 A1* | 8/2017 | Bonilla ............. H01L 21/76838 |
| 2019/0181043 A1 | 6/2019 | Leobandung |
| 2019/0214298 A1 | 7/2019 | Stephens |
| 2021/0398898 A1* | 12/2021 | Yang ................... H01L 23/5222 |

* cited by examiner

HIGH ASPECT RATIO VIAS FOR INTEGRATED CIRCUITS

BACKGROUND

The present invention relates to integrated circuits, and more specifically, to high aspect ratio vias for integrated circuits.

As features for integrated circuits are made smaller and smaller, the electrical resistance though the features can increase and the distance between layers can shrink. The latter can cause features in the layers to be very close together, which can cause increased electrical capacitance. In addition to these performance issues, forming small features can reduce chip yield and can cause long-term reliability problems.

SUMMARY

According to an embodiment of the present disclosure, an interlayer interconnect for an integrated circuit includes a first line in a first wiring layer, a first via portion integral to and extending from the first line, and a second line in a second wiring layer that is adjacent to the first wiring layer. The interlayer interconnect also includes a third line in the second wiring layer that is a first distance from the second line, wherein the first distance is a pitch of the second wiring layer, and a second via portion integral to and extending from the second line and in electrical contact with the first via portion at an interface to form a via. The via extends a second distance that is at least one-and-a-quarter times the pitch.

According to an embodiment of the present disclosure, a method of making an integrated circuit includes forming a first line in a first layer and a first via portion extending from the first line, depositing a dielectric material that covers the first line and the first via portion, etching the dielectric material to expose the first via portion, and forming a second line in a second layer and a second via portion extending from the second line and in electrical contact with the first via portion.

An interlayer interconnect for an integrated circuit includes a first line in a first wiring layer, a first via portion extending from the first line, a second line in a second wiring layer that is adjacent to the first wiring layer, and a second via portion extending from the second line and in electrical contact with the first via portion at an interface to form a via. The first via portion tapers towards the interface from a first larger size to a second smaller size, and the second via portion tapers towards the interface from a third larger size to a fourth smaller size.

According to an embodiment of the present disclosure, an interlayer interconnect for an integrated circuit includes a first line in a first wiring layer, and a first via portion extending from the first line, wherein the first via portion is comprised of a plasma-etchable metal material. The interlayer interconnect also includes a second line in a second wiring layer that is adjacent to the first wiring layer, and a second via portion extending from the second line and in electrical contact with the first via portion to form a via, wherein the second via portion is comprised of a non-plasma-etchable metal material.

According to an embodiment of the present disclosure, an integrated circuit stack includes a front end of line (FEOL) portion comprising a plurality of transistors and a first layer comprising a plurality of electrical contacts electrically connected to the plurality of transistors, wherein each of the plurality of electrical contacts is spaced apart from adjacent electrical contacts by a first pitch distance, a back end of line (BEOL) portion connected to the FEOL portion, and a via. The BEOL portion includes a second layer with a first plurality of electrical interconnects, wherein each of the first plurality of electrical interconnects are spaced apart from adjacent electrical interconnects by a second pitch distance, and a third layer with a second plurality of electrical interconnects, wherein each of the second plurality of electrical interconnects are spaced apart from adjacent electrical interconnects by a third pitch distance. The via electrically connects two of the first layer, the second layer, and a third layer, and a length of the via is at least two times longer than a smallest pitch distance of a layer that the via is electrically connected to.

DETAILED DESCRIPTION

Figure 1:
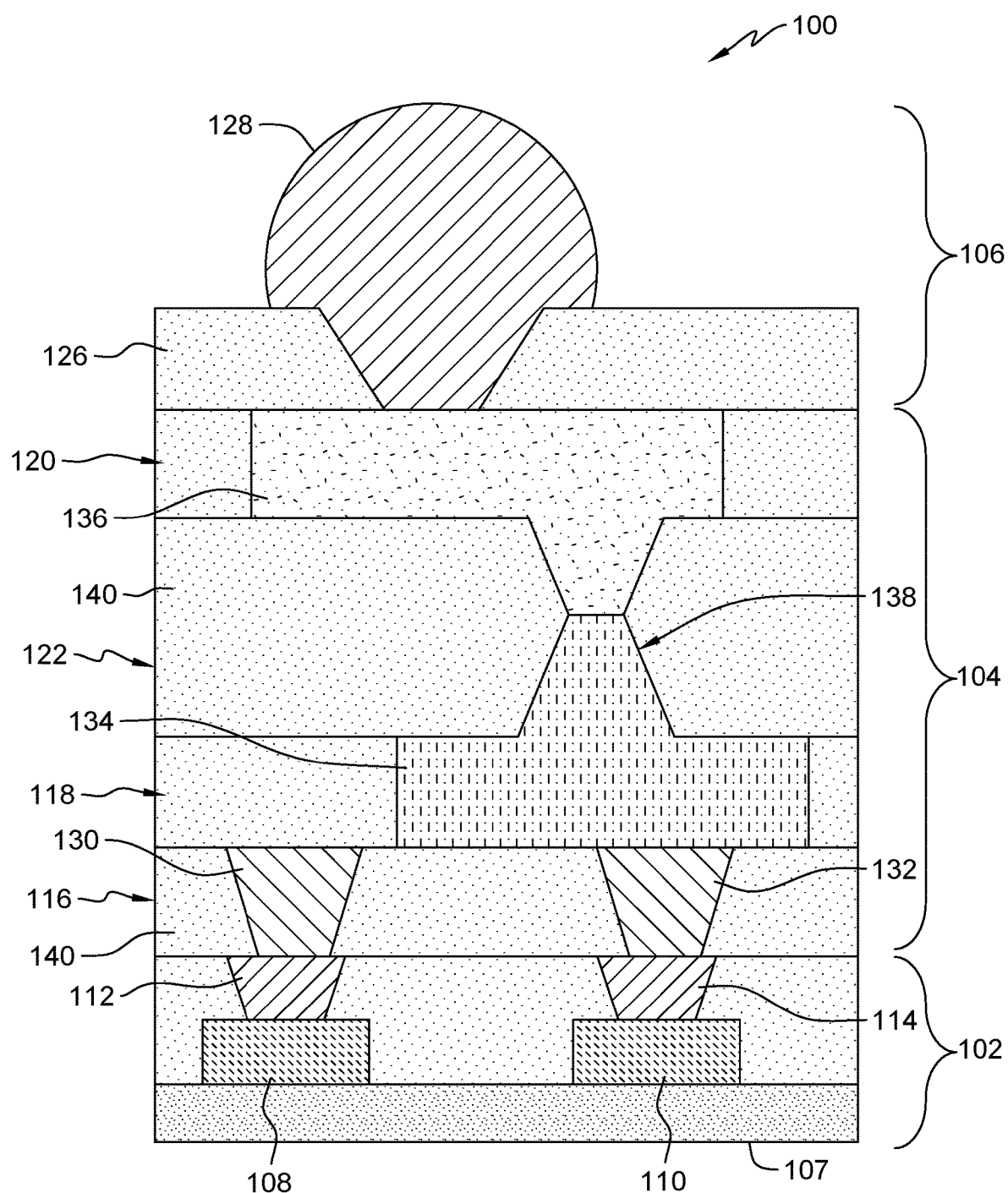
FIG. 1 is a cross-section front view of an integrated circuit chip stack, in accordance with an embodiment of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition can be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching can be any process that removes material from the wafer. Examples include etch processes (either wet or dry), chemical mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping can be the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography can be the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

FIG. 1 is a cross-section front view of integrated circuit chip stack 100. Stack 100 comprises front end of line (FEOL) portion 102, back end of line (BEOL) portion 104, and packaging portion 106. FEOL portion 102 comprises wafer 107, transistors 108, 110 formed on wafer 107. In addition, FEOL portion 102 comprises electrical contacts 112, 114 which are adjacent to one another and are connected to transistors 108, 110, respectively. BEOL portion 104 comprises wiring layers 116, 118, 120 with insulating layer 122 in between wiring layers 118 and 120. Packaging portion 106 comprises seal layer 126 and solder bump 128.

In the illustrated embodiment, wiring layers 116-120 include lines 130, 132, 134, 136, respectively, which are electrically conductive intralayer interconnects comprised of metal material(s) that extend in various directions within their respective wiring layers 116-120. For example, line 130 extends into/out of the page in FIG. 1, whereas line 136 extends across the page in FIG. 1 (although line 136 can also extend into/out of the page). Insulating layer 122 electrically insulate wiring layers 118 and 120 from each other, although via 138 is an interlayer interconnect line that extends through insulating layer 122 to connect lines 134 and 136. To insulate the electrically conductive features, FEOL portion 102 and BEOL portion 104 include dielectric material 140 therebetween.

Depicted in FIG. 1 is one embodiment of stack 100, to which there are alternative architectures. For example, stack 100 can have fewer or greater transistors, electrical contacts, wiring layers, and/or insulating layers. For a specific example, there can be fourteen wiring layers in an alternate embodiment stack 100.

Figure 2A:
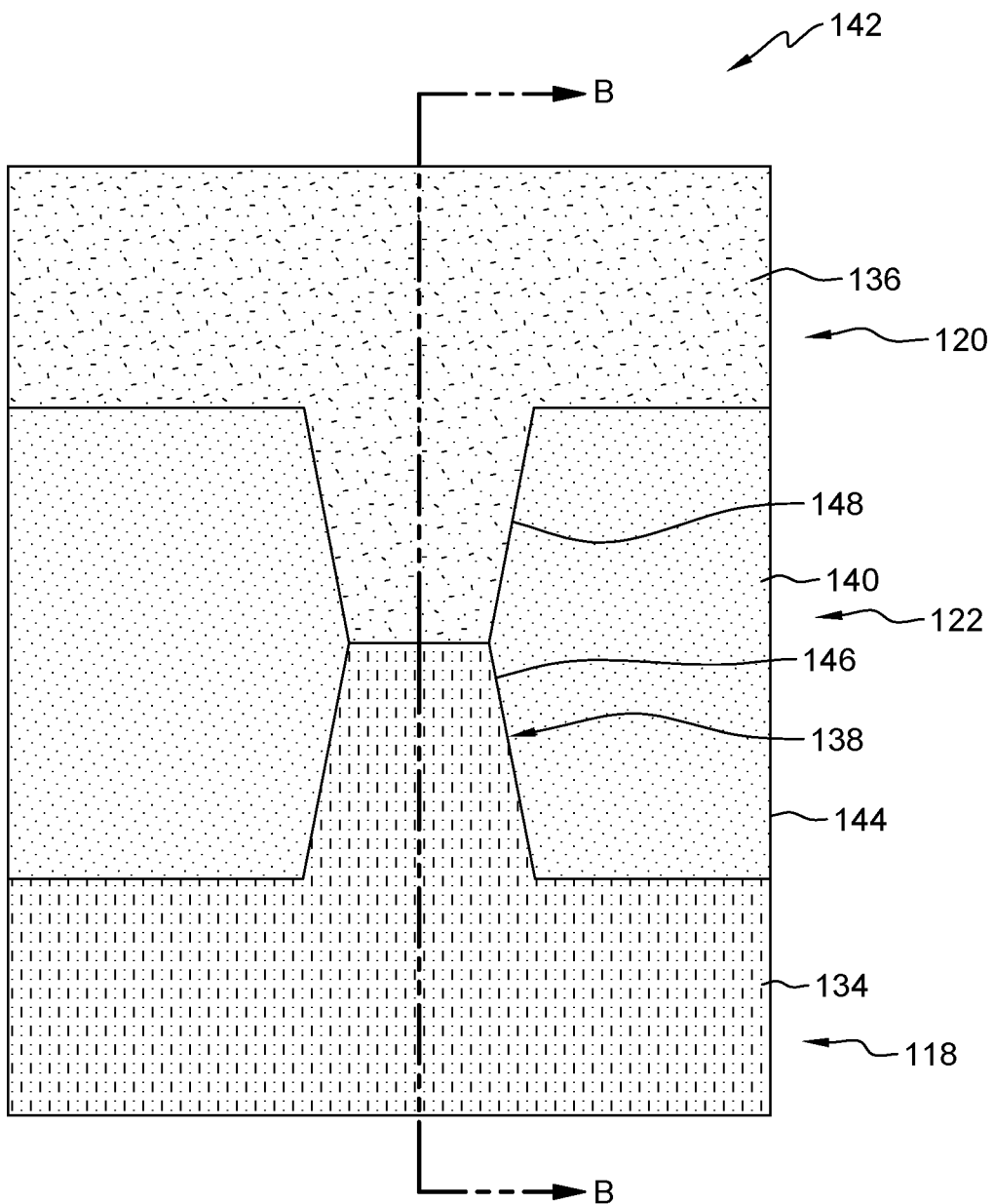
FIG. 2A is a cross-section front view of an interlayer interconnect along line A-A in FIG. 2B, in accordance with an embodiment of the present disclosure.
Figure 2B:
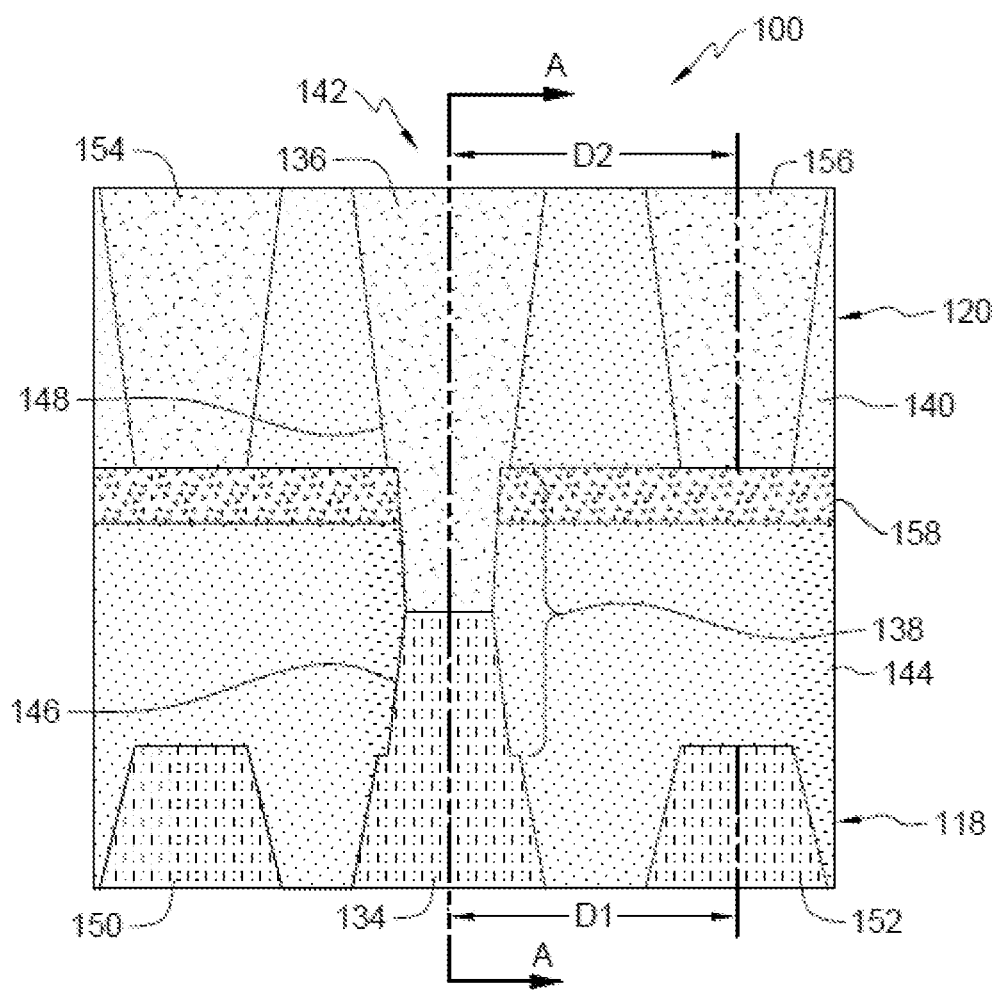
FIG. 2B is a cross-section side view of the interlayer interconnect along line B-B in FIG. 2A, in accordance with an embodiment of the present disclosure.

FIG. 2A is a cross-section front view of interlayer interconnect 142 along line A-A in FIG. 2B, and FIG. 2B is a cross-section side view of interlayer interconnect 142 along line B-B in FIG. 2A. FIGS. 2A and 2B will now be discussed in conjunction with one another. In the illustrated embodiment, interlayer interconnect 142 involves wiring layer 118, wiring layer 120, and insulating layer 122. Therefore, interlayer interconnect 142 includes line 134, line 136, via 138, and insulator 144 (which is comprised of dielectric material 140).

As stated previously, via 138 extends between line 134 and line 136 so that they are electrically connected. Via 138 has an hourglass shape because it is formed from two connected parts that are made using two different processes. More specifically, via lower 146 extends from line 134 and is integral thereto because line 134 and via lower 146 are formed using a subtractive, top-via process. In contrast via upper 148 extends from line 136 and is integral thereto because line 136 and via upper 148 are formed using an additive, damascene process that can be, for example, either single or dual. Thereby, via lower 146 tapers down in size towards via upper 148, for example, at an angle between eighty and ninety degrees or between eighty-seven and eighty-nine degrees. Similarly, via upper 148 tapers down in size towards via lower 146, for example, at an angle between eighty and ninety degrees or between eighty-seven and eighty-nine degrees. Via lower 146 and via upper 148 meet at an interface that is about halfway in between line 134 and line 136, so the length of via lower 146 is within ten percent of the length of via upper 148.

In the illustrated embodiment of FIG. 2B, lines 150 and 152 are visible, adjacent to line 134, and run in wiring layer 118 (e.g., parallel or perpendicular with respect to line 134). In addition, lines 154 and 156 are visible adjacent to line 136, and run in wiring layer 120 (e.g., parallel or perpendicular with respect to line 136). As stated previously, various lines in each wiring layer can run in different and varying directions, but a minimum distance is maintained between the lines. For example, line 134 is at a distance D1 from line 150 and from line 152, and line 136 is at a distance D2 from line 154 and from line 156. Distances D1 and D2 are measured from the same point on each adjacent line (e.g., center-on-center). Thereby, distance D1 is the pitch of wiring layer 118, and distance D2 is the pitch of wiring layer 120.

Because via 138 comprises via lower 146 and via upper 148, via 138 can be substantially longer than a traditional via. For example, the length of via 138 can be at least one-and-a-quarter times the pitch of either wiring layer 118 or wiring layer 120. While the pitches of wiring layer 118 and wiring layer 120 can be the same, traditionally, the pitch increases in stack 100 with increasing distance from wafer 107 (shown in FIG. 1) (e.g., from 36 nanometers (nm) to 360 nm). Thus, the proportion of the length of via 138 to the pitch can be measured from either of wiring layer 118 or wiring layer 120 or, for example, from an average of the two pitches. For another example, the length of via 138 can be at least one-and-a-half times the pitch of either wiring layer 118 or wiring layer 120. For another example, the length of via 138 can be at least twice the pitch of either wiring layer 118 or wiring layer 120. For another example, the length of via 138 can be between two-and-a-half and five times the pitch of either wiring layer 118 or wiring layer 120. For another example, the length of via 138 can be between three and four times the pitch of either wiring layer 118 or wiring layer 120. Thus, if the pitch of wiring layer 118 is 40 nanometers (nm), then the length of via 138 between line 134 and line 136 can be at least 80 nm, between 100 nm and 200 nm, or between 120 nm and 160 nm.

In the illustrated embodiment, dielectric material 140 can comprise silicon dioxide ($SiO_2$) and derivatives thereof. In addition, dielectric material 140 can be porous and have an ultra-low dielectric constant ($\kappa$) (e.g., $\kappa$ is less than 4.2 or $\kappa$ is between 2.5 and 3.2). Stack 100 also includes cap 158 that is positioned at the ends of lines 154 and 156. Cap 158 can comprise an etch-stopping material that can assist in the dual-damascene process of forming lines 136, 154, 156, so cap 158 can be comprised of a high dielectric constant ($\kappa$) (e.g., $\kappa$ is between 5.0 and 9.0), such as, for example, silicon nitride ($Si_3N_4$), silicon carbide (SiC), aluminum oxide ($Al_2O_3$), and aluminum nitride (AlN). While it is not shown, in some embodiments, there can be a second cap that would be positioned so that its top would be even with the bottom of via upper 148. This second cap can be made from the same high $\kappa$ material as cap 158 or a different one. In addition, in some embodiments, there can be a third cap to form a tri-layer dielectric cap, which can have one, two, or three different high $\kappa$ materials.

Forming via 138 to be so long for its width (i.e., having a large height to width ratio) allows for wiring layer 118 and wiring layer 120 to be farther apart. This can reduce capacitance between wiring layers 118, 120, for example, by seventeen percent compared to a traditional configuration with only a single-damascene line (with a cap) connected to via lower 146 (which would put lines 150-156 closer together, respectively). However, the capacitance reduction itself may be reduced if there is a second (or third) cap present compared to only having one cap 158. But there can still be a reduction of capacitance in such a configuration for both lines 134 and 136, and reducing the capacitance of interlayer interconnect 142 can increase the performance of stack 100.

Figure 3:
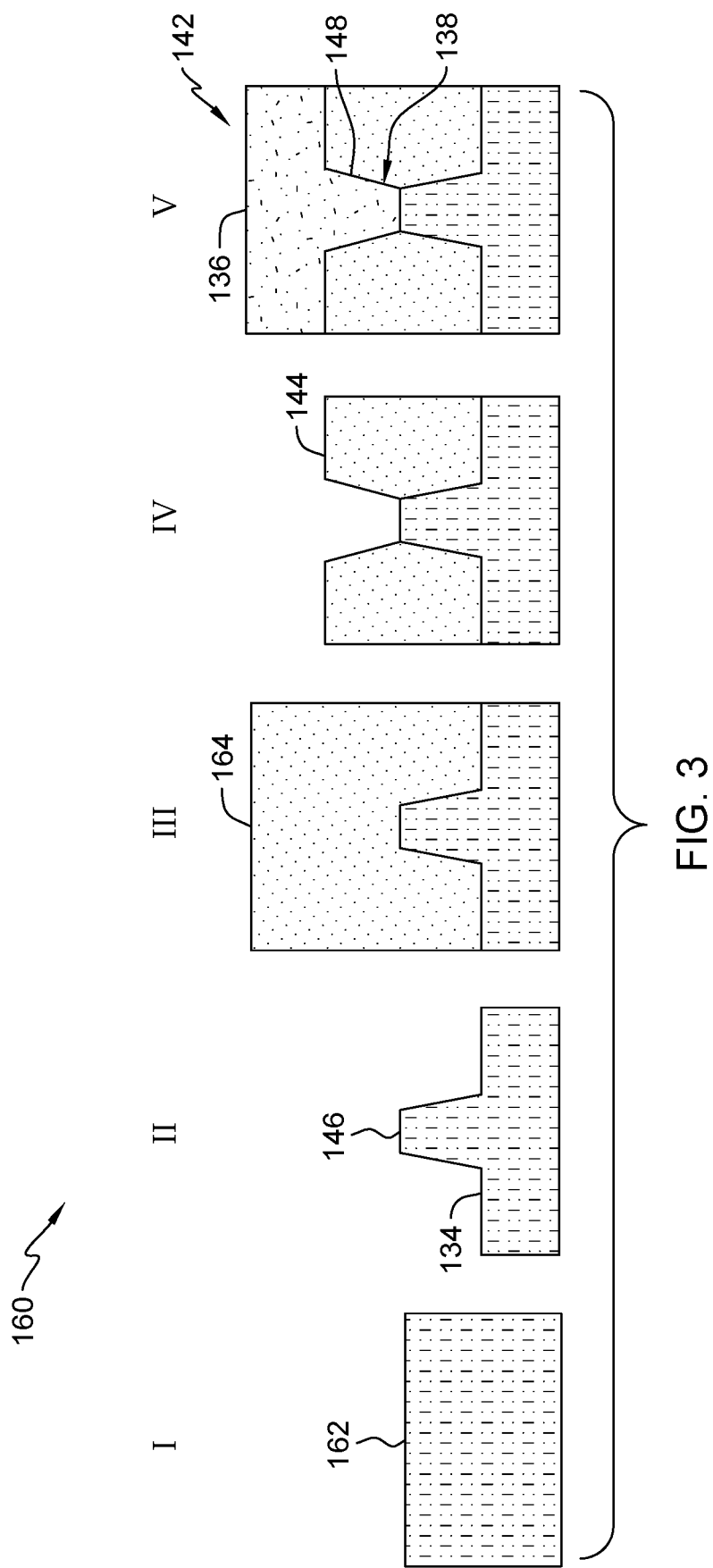
FIG. 3 is a series of cross-section front views of the process of forming the interlayer interconnect, in accordance with an embodiment of the present disclosure.

FIG. 3 is a series of cross-section front views of an example process 160 of forming interlayer interconnect 142 (shown in FIGS. 2A and 2B). In the illustrated embodiment, at view I, metal film 162 has been deposited (e.g., on top of wiring layer 116, shown in FIG. 1). At view II, blanket film 162 has been masked and subtractively etched to form line 134 with via lower 146 extending upwards therefrom. The portion of process 160 shown in views I and II can comprise the top-via process of forming a wiring layer with via(s).

At view III, dielectric film 164 has been deposited over line 134 and via lower 146. At view IV, dielectric film 164 has been chemical mechanical planarized (CMP'd), masked, and/or etched to form insulator 144. At view V, metal material has been deposited on insulator 144 to form line 136 and via upper 148, thereby completing the formation of via 138. The portion of process 160 shown in views III-V can comprise the dual-damascene process of forming a wiring layer with via(s). By process 160 including both the top-via process and the dual-damascene process, via 138 can be formed with a large aspect ratio of height to width without needing to etch a monolithic via from metal film 162 or etching a single deep hole in dielectric film 164. This allows for a greater yield to be achieved during a manufacturing run of stacks 100. In addition, it increases the long-term reliability of stacks 100 because the issues associated with extra-deep etching (e.g., lack of shape control that can lead to flaring) are absent.

Furthermore, there can be additional sub-steps in process 160 that are not depicted in views I-V. For example, the masking steps can occur as would be understood by a person having ordinary skill in the art. For another example, insulator 144 can be formed in multiple steps, for example, to allow the inclusion of one or more caps 158 (since cap 158 can function as an etch-stopping material in the dual-damascene process). In addition, there can be alternative steps to process 160. For example, instead of the deposition of dielectric film 164 being excessive (as shown) and then thinned, dielectric film 164 can be formed by a closely controlled, timed deposition that ends when dielectric film 164 is at its final height. Thereby, less planarization and/or etching may be performed. For another example, via upper 148 and line 136 can be formed in sequential single-damascene processes. In such embodiments, dielectric film 164 would be CMP'd, masked, and/or etched, and the cavity would be filled to form via upper 148. Then, any excess material from the forming of via upper 148 could be CMP'd, and then dielectric film 164 would be CMP'd, masked, and/or etched to form insulator 144. Then the cavity could be filled to form line 136 that would be connected to via upper 148.

Because the top-via process includes etching of metal film 162, line 134 and via lower 146 can comprise a metal material that is plasma-etchable, for example, by RIE. Such materials can include, for example, cobalt (Co), ruthenium (Ru), molybdenum (Mo), tungsten (W), platinum (Pt), and iridium (Ir). On the other hand, the dual-damascene process does not include etching of line 136 or via upper 148. Therefore, line 136 and via upper 148 can comprise a non-plasma-etchable material, such as, for example, copper (Cu). Copper can be a good material to use for lines and vias because it is relatively inexpensive, has a low electric resistivity, and is a mature technology. However, RIE-etchable materials can also be used for line 136 and via upper 148, such as, for example, Co, Ru, Mo, W, Pt, and Ir. While these materials can be considered exotic and may be more expensive, they may also have a lower electric resistivity at very small dimensions (e.g., such as the sizes of features in the lower end of BEOL portion 104, shown in FIG. 1). Thus, via 138 can be formed of a single metal material, or via lower 146 can be formed of a different metal material from via upper 148.

While interlayer interconnect 142 is depicted as including two wiring layers in BEOL portion 104, the structure and method of forming interlayer interconnect 142 could be employed for other interconnects in stack 100 (shown in FIG. 1). For example, interlayer interconnect 142 can exist between FEOL portion 102 (shown in FIG. 1) and BEOL portion 104 (i.e., involving wiring layer 116). Furthermore, in traditional integrated circuit stacks, every wiring layer and via in the BEOL portion can be made using solely the dual-damascene process, which means that each wiring layer can be too close to the adjacent wiring layer. Therefore, interlayer interconnect 142 (with its top-via and dual-damascene formation processes) can be employed at any of the traditional interlayer interconnects in BEOL portion 104.

However, in some embodiments, use of interlayer interconnect 142 may be limited to being used in all of the interlayer interconnects between two selected wiring layers in stack 100. In such embodiments, interlayer interconnects 142 can serve as a transition between the exotic metals used in the lower layers and the copper metal used in the upper layers.

Figure 4:
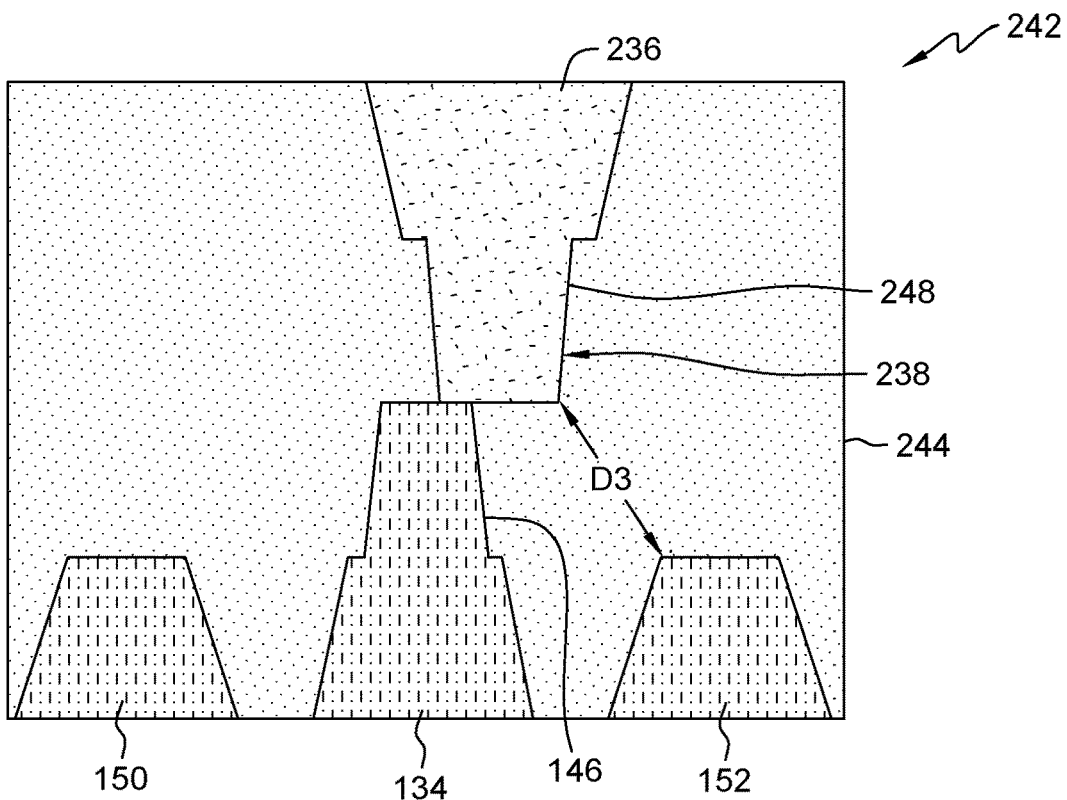
FIG. 4 is a cross-section side view of an alternate embodiment interlayer interconnect, in accordance with an embodiment of the present disclosure.

FIG. 4 is a cross-section side view of an alternate embodiment interlayer interconnect 242. Interlayer interconnect 242 can be similar to or the same as interlayer interconnect 142 (shown in FIGS. 1-3) in certain aspects. Therefore, some of these aspects may have reference numerals that are one hundred greater than those of interlayer interconnect 142.

In the illustrated embodiment, interlayer interconnect 242 comprises line 134 with via lower 146, insulator 244, and line 236 with via upper 248. Via upper 248 is substantially laterally offset from via lower 146 at the level where via upper 248 and via lower 146 meet, so via 238 has an offset, stepped hourglass shape. While such a configuration could be made purposefully, it could also be the result of an unfavorable tolerance stack up or an error in design or manufacturing. Nevertheless, interlayer interconnect 242 can maintain long term reliability because it can avoid time dependent dielectric breakdown failure. This is because via upper 248 is still sufficiently far away from other lines that it is not supposed to be connected to. More specifically, distance D3 to the closest adjacent line (i.e., line 152) is still sufficiently large. For this same reason, interlayer interconnect 242 will not reduce the maximum allowable voltage across interlayer interconnect 242.

Figure 5:
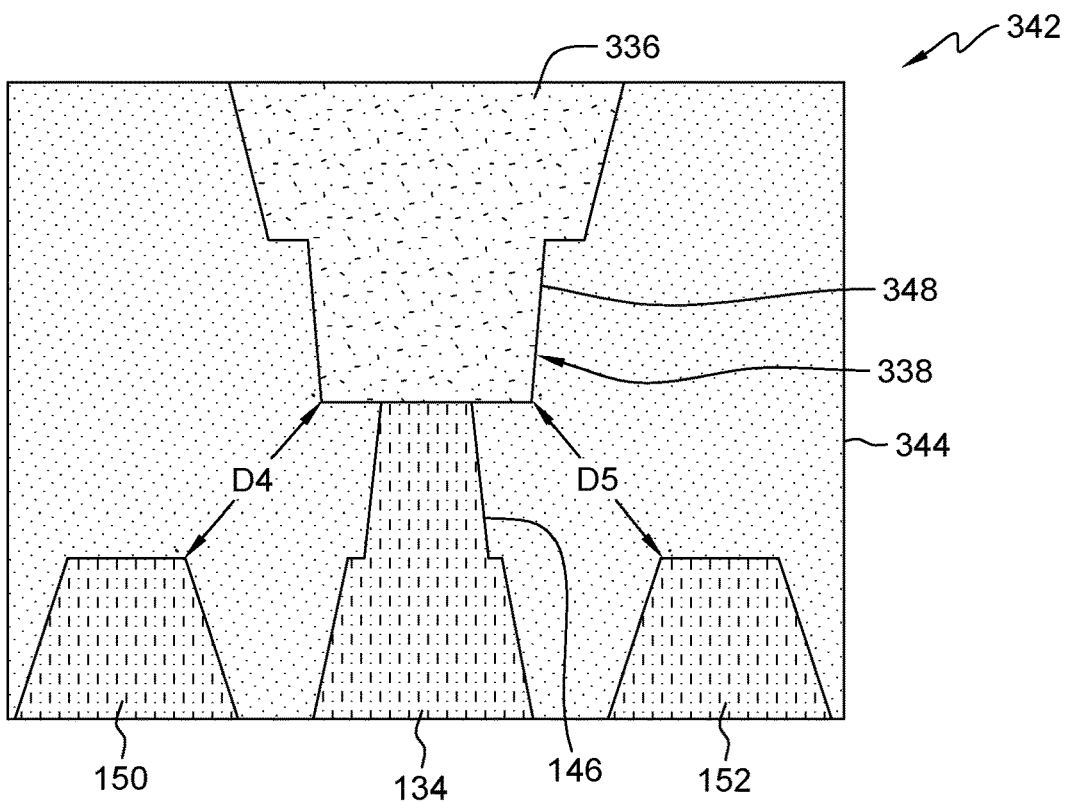
FIG. 5 is a cross-section side view of an alternate embodiment interlayer interconnect, in accordance with an embodiment of the present disclosure.

FIG. 5 is a cross-section side view of an alternate embodiment interlayer interconnect 342. Interlayer interconnect 342 can be similar to or the same as interlayer interconnect 142 (shown in FIGS. 1-3) in certain aspects. Therefore, some of these aspects may have reference numerals that are two hundred greater than those of interlayer interconnect 142.

In the illustrated embodiment, interlayer interconnect 342 comprises line 134 with via lower 146, insulator 344, and line 336 with via upper 348. Via upper 348 is at least ten percent larger than via lower 146 at the level where via upper 348 and via lower 146 meet, so via 338 has a stepped hourglass shape. In other embodiments, via upper 348 is between twenty percent and fifty percent larger than via lower 146. In other embodiments, via upper 348 can be ten percent larger than via lower 146 or between fifteen percent and twenty-five percent larger than via lower 146. In one example, if line 134 has a pitch of 30 nm and line 336 has a pitch of 36 nm, then via upper 348 could be twenty percent larger than via lower 134 if each portion of via 336 has a width that corresponds to its respective pitch.

Interlayer interconnect 342 reduces resistance compared to interlayer interconnect 142 since via upper 348 has a larger cross-sectional area than via upper 148. But there is not increased capacitance because insulator 344 is the same thickness as insulator 144. In addition, interlayer interconnect 342 can maintain long term reliability because it can avoid time dependent dielectric breakdown failure. This is because via upper 348 is still sufficiently far away from other lines that it is not supposed to be connected to. More specifically, distance D4 to adjacent line 150 and distance D5 to adjacent line 152 are still sufficiently large. Furthermore, interlayer interconnect 342 can provide a greater physical connection between via lower 146 and via upper 348 in case of a misalignment of via lower 146 and via upper 348 (a la interlayer interconnect 242, shown in FIG. 4).

Further Discussion of Some Exemplary Embodiments

The following are non-exclusive descriptions of some exemplary embodiments of the present disclosure.

An interlayer interconnect for an integrated circuit, according to an exemplary embodiment of this disclosure, among other possible things, includes: a first line in a first wiring layer; a first via portion integral to and extending from the first line; a second line in a second wiring layer that is adjacent to the first wiring layer; a third line in the second wiring layer that is a first distance from the second line, wherein the first distance is a pitch of the second wiring layer; and a second via portion integral to and extending from the second line and in electrical contact with the first via portion at an interface to form a via; wherein the via extends a second distance that is at least one-and-a-quarter times the pitch.

The interlayer interconnect of the preceding paragraph can optionally include, additionally and/or alternatively, any one or more of the following features, configurations, and/or additional components:

A further embodiment of the foregoing interlayer interconnect, wherein the second distance is at least one-and-a-half times the pitch.

A further embodiment of any of the foregoing interlayer interconnects, wherein a length of the first via portion is within ten percent of a length of the second via portion.

A further embodiment of any of the foregoing interlayer interconnects, wherein the first via portion is comprised of a plasma-etchable metal material.

A further embodiment of any of the foregoing interlayer interconnects, wherein the second via portion is comprised of a non-plasma-etchable metal material.

A method of making an integrated circuit, according to an exemplary embodiment of this disclosure, among other possible things, includes: forming a first line in a first layer and a first via portion extending from the first line; depositing a dielectric material that covers the first line and the first via portion; etching the dielectric material to expose the first via portion; and forming a second line in a second layer and a second via portion extending from the second line and in electrical contact with the first via portion.

The method of the preceding paragraph can optionally include, additionally and/or alternatively, any one or more of the following features, configurations, and/or additional components:

A further embodiment of the foregoing method, further comprising: thinning the dielectric material using chemical mechanical planarization prior to etching the dielectric material.

A further embodiment of any of the foregoing methods, wherein: the first line is one of a plurality of lines that are spaced apart by at least a distance; and a length of the first via portion plus the second via portion is at least one-and-a-quarter times the distance.

A further embodiment of any of the foregoing methods, wherein the second via portion is comprised of a plasma-etchable metal material.

A further embodiment of any of the foregoing methods, wherein the second via portion is comprised of a non-plasma-etchable metal material.

An interlayer interconnect for an integrated circuit, according to an exemplary embodiment of this disclosure, among other possible things, includes a first line in a first wiring layer; a first via portion integral to and extending from the first line; a second line in a second wiring layer that is adjacent to the first wiring layer; and a second via portion integral to and extending from the second line and in electrical contact with the first via portion at an interface to form a via; wherein the first via portion tapers towards the interface from a first larger size to a second smaller size; and wherein the second via portion tapers towards the interface from a third larger size to a fourth smaller size.

The interlayer interconnect of the preceding paragraph can optionally include, additionally and/or alternatively, any one or more of the following features, configurations, and/or additional components:

A further embodiment of the foregoing interlayer interconnect, wherein the fourth smaller size is at least ten percent larger than the second smaller size such that the via has a stepped hourglass shape.

A further embodiment of any of the foregoing interlayer interconnects, wherein the first via portion is laterally offset from the second via portion such that the via has an offset, stepped hourglass shape.

A further embodiment of any of the foregoing interlayer interconnects, wherein the first via portion is integral to the first line.

A further embodiment of any of the foregoing interlayer interconnects, wherein the second via portion is integral to the second line.

An interlayer interconnect for an integrated circuit, according to an exemplary embodiment of this disclosure, among other possible things, includes: a first line in a first wiring layer; a first via portion extending from the first line, wherein the first via portion is comprised of a plasma-etchable metal material; a second line in a second wiring layer that is adjacent to the first wiring layer; and a second via portion extending from the second line and in electrical contact with the first via portion to form a via, wherein the second via portion is comprised of a non-plasma-etchable metal material.

The interlayer interconnect of the preceding paragraph can optionally include, additionally and/or alternatively, any one or more of the following features, configurations, and/or additional components:

A further embodiment of the foregoing interlayer interconnect, wherein the plasma-etchable metal material is selected from the group consisting of: cobalt, ruthenium, molybdenum, tungsten, platinum, and iridium, and the non-plasma-etchable metal material consists essentially of copper.

A further embodiment of any of the foregoing interlayer interconnects, wherein the first line is comprised of the plasma-etchable metal material and is integral to the first via portion; and he second line is comprised of the non-plasma-etchable metal material and is integral to the second via portion.

A further embodiment of any of the foregoing interlayer interconnects, wherein a width of the second via portion is at least ten percent larger than a width of the first via portion at a level where the first via portion contacts the second via portion.

A further embodiment of any of the foregoing interlayer interconnects, wherein a length of the first via portion is within ten percent of a length of the second via portion.

An integrated circuit stack, according to an exemplary embodiment of this disclosure, among other possible things, includes: a front end of line (FEOL) portion comprising a plurality of transistors and a first layer comprising a plurality of electrical contacts electrically connected to the plurality of transistors, wherein each of the plurality of electrical contacts is spaced apart from adjacent electrical contacts by a first pitch distance; a back end of line (BEOL) portion connected to the FEOL portion, the BEOL portion comprising: a second layer with a first plurality of electrical interconnects, wherein each of the first plurality of electrical interconnects are spaced apart from adjacent electrical interconnects by a second pitch distance; and a third layer with a second plurality of electrical interconnects, wherein each of the second plurality of electrical interconnects are spaced apart from adjacent electrical interconnects by a third pitch distance; and a via that electrically connects two of the first layer, the second layer, and a third layer, wherein a length of the via is at least two times longer than a smallest pitch distance of a layer that the via is electrically connected to.

The integrated circuit stack of the preceding paragraph can optionally include, additionally and/or alternatively, any one or more of the following features, configurations, and/or additional components:

A further embodiment of the foregoing circuit stack, wherein the via electrically connects the first layer and the second layer.

A further embodiment of any of the foregoing circuit stacks, wherein the via electrically connects the second layer and the third layer.

A further embodiment of any of the foregoing circuit stacks, wherein: the via comprises a first portion and second portion; the first portion tapers down in size toward that second portion; the second portion tapers in size down toward the first portion; and a length of the first portion is within ten percent of a length of the second portion.

A further embodiment of any of the foregoing circuit stacks, wherein: the first portion is formed using a top-via process; and the second portion is formed using a dual-damascene process.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An interlayer interconnect for an integrated circuit comprising:
    a first line in a first wiring layer;
    a first via portion integral to and extending from the first line;
    a second line in a second wiring layer that is adjacent to the first wiring layer;
    a third line in the second wiring layer that is a first distance from the second line, wherein the first distance is a pitch of the second wiring layer; and
    a second via portion integral to and extending from the second line and in electrical contact with the first via portion at an interface to form a via;
    wherein the via extends a second distance that is at least one-and-a-quarter times the pitch.

2. The interlayer interconnect of claim 1, wherein the second distance is at least one-and-a-half times the pitch.

3. The interlayer interconnect of claim 1, wherein a length of the first via portion is within ten percent of a length of the second via portion.

4. The interlayer interconnect of claim 1, wherein the first via portion is comprised of a plasma-etchable metal material.

5. The interlayer interconnect of claim 4, wherein the second via portion is comprised of a non-plasma-etchable metal material.

6. An interlayer interconnect for an integrated circuit comprising:
    a first line in a first wiring layer;
    a first via portion extending from the first line;
    a second line in a second wiring layer that is adjacent to the first wiring layer; and
    a second via portion extending from the second line and in electrical contact with the first via portion at an interface to form a via;
    wherein the first via portion tapers towards the interface from a first larger size to a second smaller size; and
    wherein the second via portion tapers towards the interface from a third larger size to a fourth smaller size.

7. The interlayer interconnect of claim 6, wherein the fourth smaller size is at least ten percent larger than the second smaller size such that the via has a stepped hourglass shape.

8. The interlayer interconnect of claim 6, wherein the first via portion is laterally offset from the second via portion such that the via has an offset, stepped hourglass shape.

9. The interlayer interconnect of claim 6, wherein the first via portion is integral to the first line.

10. The interlayer interconnect of claim 9, wherein the second via portion is integral to the second line.

11. An interlayer interconnect for an integrated circuit comprises:
    a first line in a first wiring layer;
    a first via portion extending from the first line, wherein the first via portion is comprised of a plasma-etchable metal material;
    a second line in a second wiring layer that is adjacent to the first wiring layer; and
    a second via portion extending from the second line and in electrical contact with the first via portion to form a via, wherein the second via portion is comprised of a non-plasma-etchable metal material.

12. The interlayer interconnect of claim 11, wherein:
    the plasma-etchable metal material is selected from the group consisting of: cobalt, ruthenium, molybdenum, tungsten, platinum, and iridium; and
    the non-plasma-etchable metal material consists essentially of copper.

13. The interlayer interconnect of claim 11, wherein:
    the first line is comprised of the plasma-etchable metal material and is integral to the first via portion; and
    the second line is comprised of the non-plasma-etchable metal material and is integral to the second via portion.

14. The interlayer interconnect of claim 11, wherein a width of the second via portion is at least ten percent larger than a width of the first via portion at a level where the first via portion contacts the second via portion.

15. The interlayer interconnect of claim 14, wherein a length of the first via portion is within ten percent of a length of the second via portion.

16. An integrated circuit stack comprising:
    a front end of line (FEOL) portion comprising a plurality of transistors and a first layer comprising a plurality of electrical contacts electrically connected to the plurality of transistors, wherein each of the plurality of electrical contacts is spaced apart from adjacent electrical contacts by a first pitch distance;
    a back end of line (BEOL) portion connected to the FEOL portion, the BEOL portion comprising:
        a second layer with a first plurality of electrical interconnects, wherein each of the first plurality of electrical interconnects are spaced apart from adjacent electrical interconnects by a second pitch distance; and
        a third layer with a second plurality of electrical interconnects, wherein each of the second plurality of electrical interconnects are spaced apart from adjacent electrical interconnects by a third pitch distance; and
    a via that electrically connects two of the first layer, the second layer, and a third layer, wherein a length of the via is at least two times longer than a smallest pitch distance of a layer that the via is electrically connected to.

17. The integrated circuit stack of claim 16, wherein the via electrically connects the first layer and the second layer.

18. The integrated circuit stack of claim 16, wherein the via electrically connects the second layer and the third layer.

19. The integrated circuit stack of claim 16, wherein:
the via comprises a first portion and second portion;
the first portion tapers down in size toward that second portion;
the second portion tapers in size down toward the first portion; and
a length of the first portion is within ten percent of a length of the second portion.

20. The integrated circuit stack of claim 19, wherein:
the first portion is formed using a top-via process; and
the second portion is formed using a dual-damascene process.

\* \* \* \* \*